United States Patent [19]

Barton

[11] 4,103,347
[45] Jul. 25, 1978

[54] ZIG-ZAG SPS CCD MEMORY

[75] Inventor: James Brockman Barton, Richardson, Tex.

[73] Assignee: Texas Instruments Incorporated, Dallas, Tex.

[21] Appl. No.: 736,904

[22] Filed: Oct. 29, 1976

[51] Int. Cl.² ............... G11C 19/28; G11C 11/34; G11C 9/00
[52] U.S. Cl. .................. 365/219; 307/221 D; 357/24; 365/183
[58] Field of Search .......... 340/173 R; 307/221 C, 307/221 D; 357/24; 365/183, 219

[56] References Cited

U.S. PATENT DOCUMENTS

| 3,789,240 | 1/1974 | Weimer | 307/221 C |
| 3,953,837 | 4/1976 | Cheek | 340/173 R |
| 3,967,254 | 6/1976 | Kosonocky et al. | 340/173 R |
| 4,024,509 | 5/1977 | Elmer | 340/173 R |

OTHER PUBLICATIONS

Sangster, Integrated bucket-brigade delay line using MOS tetrodes, Philips Technical Review, 1970, vol. 31, pp. 266 & 283.

Osamu Ohtsuki et al., CCD with Meander Channel, The Technology and Applications of Charge Coupled Devices, 3rd International Conference, University of Edinburgh, 9/76, pp. 38-43.

Primary Examiner—Stuart N. Hecker
Attorney, Agent, or Firm—James T. Comfort; Rene' E. Grossman; William E. Hiller

[57] ABSTRACT

A CCD memory is comprised of an array of serial-parallel-serial memory blocks. Each block is comprised of an N-stage serial-parallel register, an M-stage stack, and an N-stage parallel-serial register. The serial-parallel register has N outputs which couple in parallel to N inputs of the stack. The parallel-serial register has N inputs which couple in parallel to N outputs of the stack. Both registers have a zig-zag shaped charge transfer path which reduces their linear dimension, and also reduces the width of the stack.

14 Claims, 8 Drawing Figures

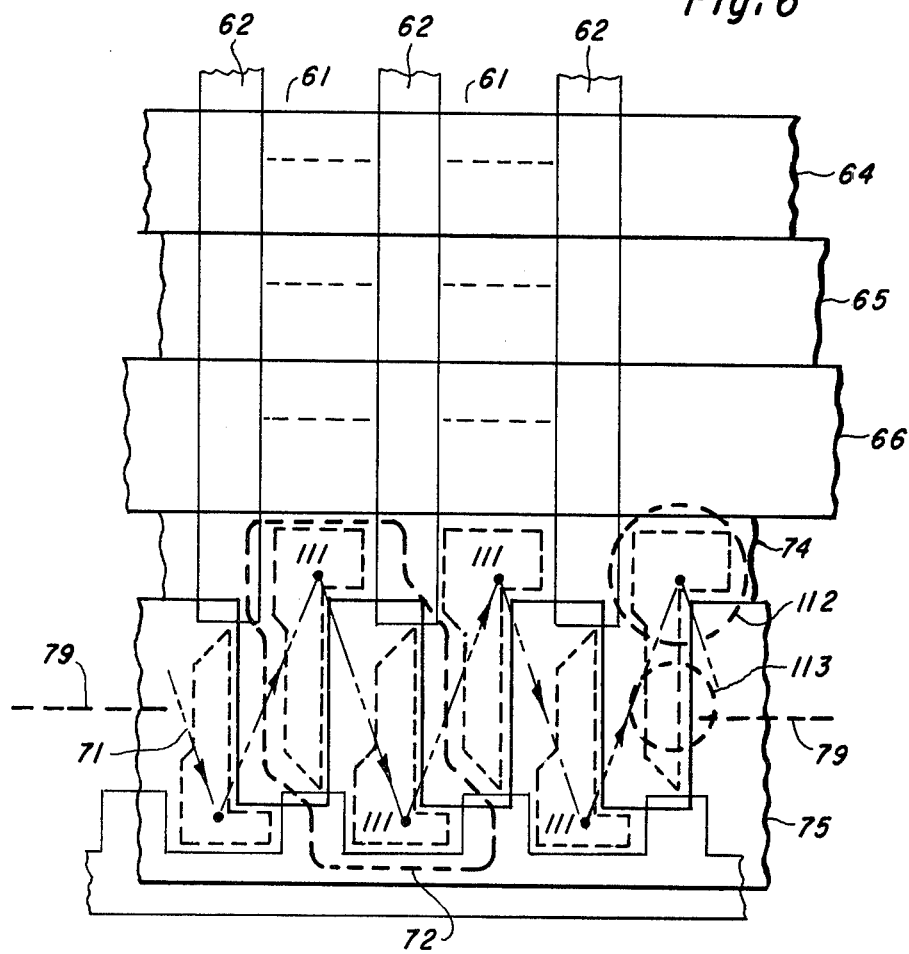

ZIG-ZAG SPS CCD MEMORY

BACKGROUND OF THE INVENTION

This invention relates to charge coupled device memories (CCD memories), and more particularly to a unique CCD memory architecture which results in greater storage capacity.

CCD memories are used in digital computer systems for storing information in binary form. These computer systems have an almost infinite variety of applications, and thus the demand for such memories is large.

Presently available CCD memories have access times of approximately 100 microseconds. This is slower than the access time MOS/$T^2L$ memories, but faster than the access time of disc/tape memories. For example, the access time is approximately 50 to 300 nanoseconds for the former, and approximately 10 milliseconds to several seconds for the latter. CCD memories are therefore used as fast auxiliary memories to tapes and discs. They are also used as "fast memories" in computers where the higher MOS/$T^2L$ speeds are not required.

A critical parameter for the CCD memory chip is the number of bits per chip. This is because the tendency of computer systems over the years has been to require larger amounts of memory storage. Thus, various design efforts have been employed to increase the number of bits per chip. As a result, sixteen thousand bits per chip is not uncommon today. See, for example, *IEEE Journal of Solid-State Circuits*, Feb. 76, pp 1-74. And efforts continue to be made to increase this figure.

A popular architecture for the CCD memory is the serial-parallel-serial (SPS) organization. Binary bits are first serially loaded into a shift register. When the register is full, the bits are loaded in parallel into a first in-first out stack. The bits are then moved in parallel through column transfer channels within the stack. At the stack output, they are loaded in parallel into another shift register. The bits are then shifted serially into a detection device.

A major advantage of the SPS architecture is that it requires only one detection device, which thus can be relatively sophisticated yet occupy a relatively small amount of total chip area. On this point see, for example, *Charge Transfer Devices* Carlo H. Sequin and Michael F. Tompsett, p. 245, 1975. However, a major disadvantage is that chip space between the column transfer channels of the stack is wasted. This is because the column transfer channels must line up with the parallel output/inputs of the two registers; and the spacing between successive outputs/inputs of the register is larger than that which is required to physically build the column transfer channels.

In the past, one technique which has been employed to reduce the space between successive outputs/inputs of the registers is to provide two outputs/inputs per stage, instead of the usual one. But the problem with this technique is that it requires a complicated clocking scheme to control its operation. The input register must be loaded twice to fill the column transfer channels, and the output register must be unloaded twice to empty the column transfer channel.

Another technique which has been employed to increase the number of memory storage bits per chip is to utilize a serpentine architecture. This architecture utilizes plurality of shift registers, interconnected in series, and thus eliminates this column channel spacing problem. However, it creates a new problem. The serial path for each bit is lengthened, and thus refresh stages must be added at intermediate points to regenerate the signal as it passes through the serial chain.

In view of the deficiencies of the prior art, it is therefore one objective of this invention to provide an improved SPS CCD memory.

Another objective is to provide a SPS CCD memory with increased storage capacity.

Still another objective is to provide an SPS CCD memory having reduced space between the column transfer channels.

BRIEF SUMMARY OF THE INVENTION

These and other objectives are accomplished in accordance with the invention in which a CCD memory is constructed of a plurality of SPS memory blocks. Each of the blocks includes an N-stage serial-parallel register, an M-stage stack, and an N-stage parallel-serial register. Each stage of the serial-parallel register has one output, and it couples to a selected column transfer channel in the stack. Each stage of the parallel-serial register has one input, and it couples to a selected output of the stack. The two registers have zig-zag shaped charge transfer paths. This charge transfer path is formed by creating potential wells with ion implants which are laterally offset from each other along a common center line. The zig-zag shape of the charge transfer path reduces the linear dimension of the registers and thus permits the column transfer channels of the stack to be closer together.

BRIEF DESCRIPTION OF DRAWINGS

The novel features believed characteristic of the invention are set forth in the appended claims; the invention itself, however, as well as other features and advantages thereof, will best be understood by reference to the following detailed description of particular embodiments, read in conjunction with the accompanying drawings, wherein:

FIG. 5b-5c is a potential diagram taken along the zig-zag shaped charge transfer path of FIG. 5a; and FIG. 6 is a greatly enlarged top view of a portion of the parallel-serial register that is utilized by the SPS memory element of FIG. 2.

DETAILED DESCRIPTION OF SPECIFIC EMBODIMENTS

Figure 1:
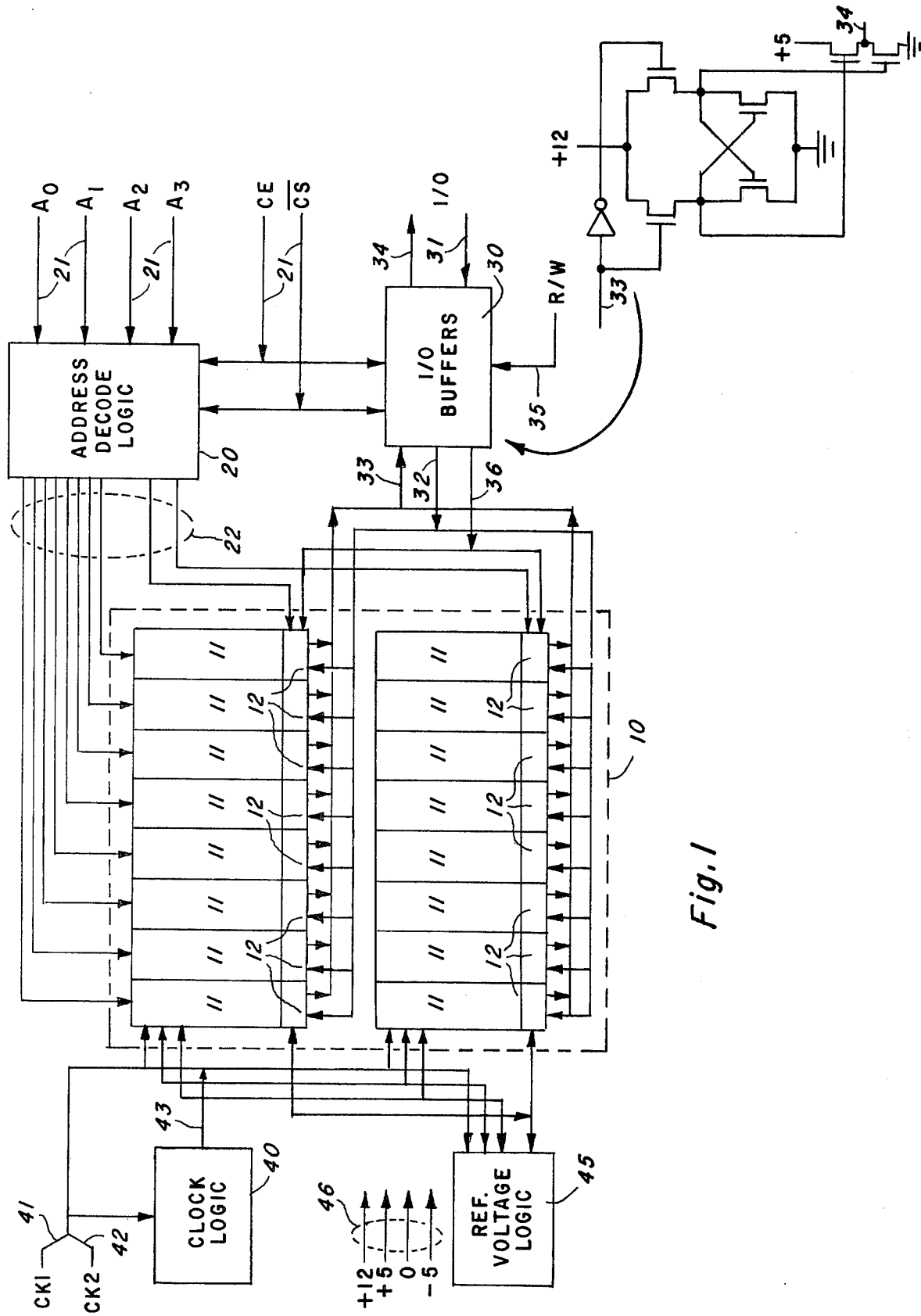
FIG. 1 is a block diagram of a 64K CCD memory which is one embodiment of the invention.

Referring to FIG. 1, a block diagram of one embodiment of the invention is illustrated. This embodiment is called a charge coupled device memory (CCD memory). This particular memory has a capacity of storing approximately 64,000 bits of binary information. The memory is implemented with charge coupled devices (CCDs), and is fabricated on a single semiconductor chip.

Basically, the CCD memory consists of a storage array 10, address decode logic 20, input/ouput logic 30, clock logic 40, and reference voltage logic 45. Power is supplied to these components via leads 46. Storage array 10 is basically comprised of sixteen serial-parallel-serial (SPS) memory blocks 11. Regeneration logic 12 is provided for each block. Each of the sixteen blocks has a capacity of storing 4,096 bits of binary information.

Address logic 20 selects one of the sixteen memory blocks 11 in response to address signals A0–A3, CE and $\overline{CS}$. The address logic may be implemented with previously described logic means, an example of which is described in IEEE Transactions on Electron Devices, Volume ED-23, pp. 117–126, Feb. 1976. The address signals are generated external to the CCD memory, and are applied to the memory via leads 21. When signal CE is at a high voltage level and signal $\overline{CS}$ is at a low voltage level, address decode logic 20 is enabled. Decode logic 20 receives signals A0–A3 on leads 21, decodes the A0–A3 signals, and generates selection signals on leads 22. Leads 22 selectively couple to one memory block-regeneration logic pair, and the signals generated thereon are interpreted as selection signals.

Binary information is written into a selected SPS memory block in the following manner. A lead 31 couples to input/output logic 30, and binary information is applied to it from a source external to the CCD memory. Input/output logic 30 buffers the signal on lead 31 onto a lead 32. Lead 32 couples to an input of the regeneration logic for each of the SPS memory blocks, but signal on lead 32 is accepted only by the selected block. Any one of several regeneration structures may be used in conjunction with the memory blocks. An example of one such regeneration device is described in co-pending U.S. patent application Ser. No. 499,717 filed Aug. 22, 1974, by William M. Gosney and is assigned to Texas Instruments Incorporated now U.S. Pat. Nos. 3,979,603 and 4,060,737.

Similarly, binary information is read from a selected SPS memory block via leads 33 and 34. Lead 33 couples to an output of each of the SPS memory blocks through the regeneration logic 12. A selected block utilizes reference voltage signals formed by the reference voltage logic 45 to sense the selected bits and generate information signals on lead 33. Input/output logic 30 couples to lead 33 and buffers the signals on lead 33 onto lead 34. The buffered signals on lead 34 are sensed by logic external to the CCD memory. An example of one circuit used to buffer the signals on lead 33 is illustrated in FIG. 1a.

The above described write and read operation is further controlled by signals R/$\overline{W}$, CK1, and CK2. These signals are applied to the CCD memory via leads 35, 41, and 42 respectively. Lead 35 couples to input/output logic 30 and also drives a lead 36 which couples to the regeneration logic 12 of each block. A high voltage on lead 35 is interpreted as a read command, and a low voltage is interpreted as a write command. Leads 41 and 42 couple to each of the SPS memory blocks 11, and to clock logic 40. Clock logic 40 receives signals CK1 and CK2 on leads 41 and 42, and in response generates clock signals SP1, SP2, P1, P2, P3, P4, PS1, and PS2. These signals control the timing of charge-transfers within SPS memory blocks 11. Several leads 43 couple clock logic 40 to SPS memory blocks 11 and carry the generated clock signals.

An important novel aspect of the above described CCD memory lies in the arthitecture of SPS memory blocks 11. The novel arthitecture reduces the amount of semiconductor surface area that is required to implement each of the memory blocks. This is a highly desirable result because higher storage capacity memories are continually in demand, and reducing the surface area per block significantly increases the amount of memory that can be packaged on a given chip size.

Figure 2:
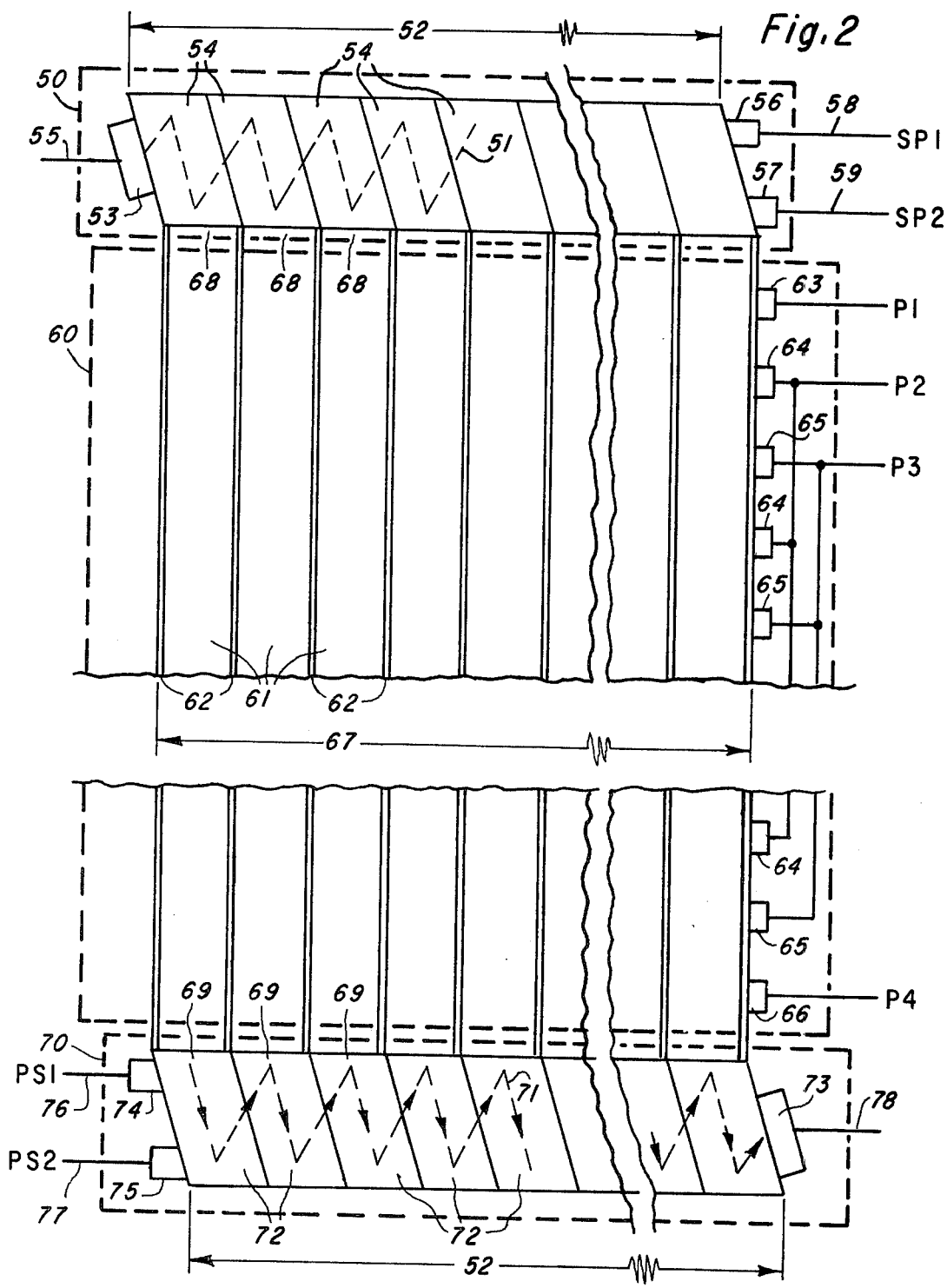
FIG. 2 is a block diagram of an SPS memory block which is utilized by the memory of FIG. 1.

Referring then to FIG. 2, a block diagram (not to scale) of an SPS memory block illustrates the unique SPS memory arthitecture. Basically, the memory block consists of an N-stage serial-parallel register 50, an M-stage stack 60, and an N-stage parallel-serial register 70. Registers 50 and 70 have zig-zag shaped charge transfer paths 51 and 71 respectively. The zig-zag shape reduces the linear dimension 52 of registers 50 and 70, and the width 67 of the SPS memory block 60, and thus reduces the total surface area of the block. The details of this zig-zag architecture is discussed in full later in the specification.

Serial-parallel register 50 is comprised of a charge input device 53, and N serially connected stages 54. Charge input device 53 has an input lead 55 for receiving data input signals. Device 53 generates charge packets, representing a "0" or "1", in response to input signals on lead 55. This charge is moved from stage to stage in a manner along the zig-zag shaped charge transfer path 51. Each stage includes first and second phase serial transfer electrodes 56 and 57 to control the transfer of this charge. Leads 58 and 59 couple respectively to electrodes 56 and 57 of each stage. Clock signals SP1 and SP2 are applied to leads 58 and 59 respectively.

Stack 60 is comprised of a plurality of column channels 61 and column channel stops 62 - the latter of which is illustrated as a double line. Each stage 54 of register 50 has an output region which couples to an input 68 of one of the column channels. Channels 61 and channel stops 62 have a straight shape (as opposed to a zig-zag shape). The channels and channel stops alternate in parallel with each other, and are perpendicular to register 50. Stack 60 includes a serial-parallel transfer electrode 63, a plurality of first and second phase and parallel transfer electrodes 64 and 65, and a parallel-serial transfer electrode 66 for moving charge through the column channels. These electrodes lie perpendicular to and extend across all of the channels. In addition, electrode 63 partially overlies the output region of stages 54 in register 50. Leads 67 couple to electrodes 63, 64, 65 and 66; and clock signals P1, P2, P3, P4 respectively are applied to these electrodes to control the charge movement.

The area required to implement stack 60 is reduced in this invention by making column channel stops 67 no wider than is necessary to provide electrical isolation between adjacent column channels. This results in a column channel stop which has a width that is less than the width of the column channels. In one particular embodiment, the channel stop width is approximately 0.2 mil, and the channel width is approximately 0.4 mil. The channel width is dictated by the maximum amount of charge which the column channel must pass. Prior to this invention, the center-to-center spacing of the column channels was dictated by the width of the serial transfer electrodes 56 and 57 on register 50, but the novel zig-zag shaped charge transfer path of this invention eliminates that constraint.

Parallel-serial register 70 is comprised of N serially connected stages 72 and one charge detection device 73. Each stage 72 has an input region which couples to the output 69 of one column channel. Transfer electrode 66 partially overlies the input region of register 70. Each stage 72 includes first and second phase serial transfer electrodes 74 and 75 to control the transfer of charge through the register. Leads 76 and 77 couple respectively to electrodes 74 and 75; and clock signals PS1 and PS2 are applied thereto. Charge detection device 73 senses the presence or absence of charge representing a binary "1" or binary "0" in the last stage, and generates an output signal on a lead 78 reflecting the sensed charge level.

Figure 3:
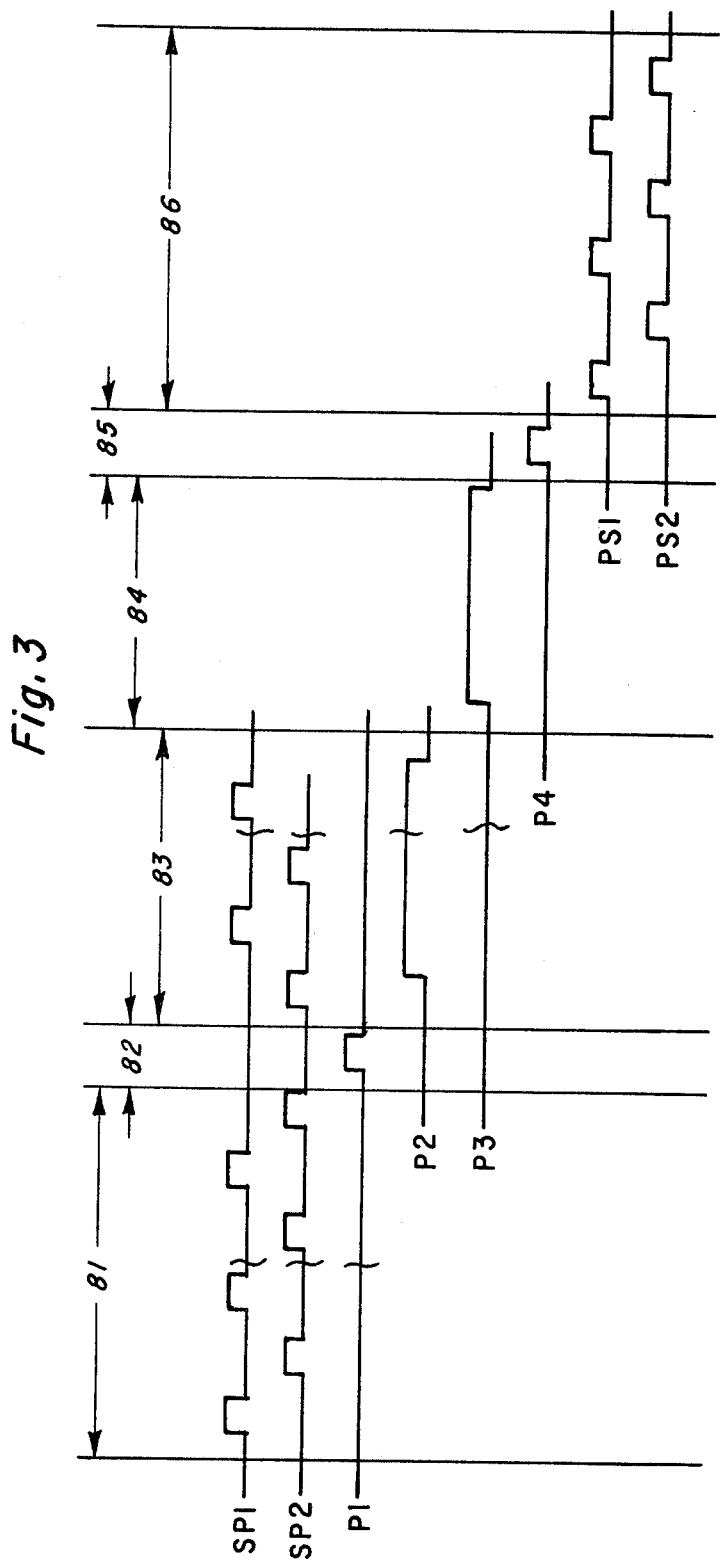
FIG. 3 is a timing diagram for the SPS memory block of FIG. 2.

Referring to FIG. 3, a timing diagram of SPS memory block 11 is illustrated. This diagram explains one sequence in which charge is moved through the components of the memory block.

During a time interval 81, input device 53 injects charge packets in response to sequential digital input signals on lead 55. Clocks SP1 and SP2 alternate to move these injected charge packets through the N stages of register 50. For an N-channel device, all the charge packets lie in potential wells under electrode 56 when clock SP1 is at a high voltage level and clock SP2 is low. Conversely, when clock SP1 is low and clock SP2 is high, the charge packets move into potential wells under electrodes 57. Thus, after N cycles of this SP1-SP2 clock sequence, each stage of register 50 has a charge packet stored in it.

During a time interval 82, clock signal P1 is at a high voltage level and the set of charge packets in register 50 moves in parallel from each stage of register 50 in to stack 60 under electrode 63. Clock signals SP1 and SP2 are both low during this time interval.

In a subsequent timing interval 83, clock signal P2 goes high and the charge packets under electrode 63 move under an adjacent electrode 64. Also, the SP1-SP2 clock sequence continues and register 50 begins to refill.

During another time interval 84, clock P2 is low and clock P3 is high, and the charge packets in stack 60 move under electrodes 65. Also, the SP1-SP2 clock sequence continued to refill register 50.

In another time interval 85, clock P4 is high and charge packets move under electrode 66 from under the adjacent electrode 65. Note that this is not the same set of charge packets that was moved from register 50 into stack 60 during the preceding time interval 82. Timing intervals 83 and 84 must be repeated M times for one particular set of charge packets to propagate through stack 60. Also during timing interval 85, a new set of charge packets may be moved from register 50 into stack 60.

In still another time interval 86, clocks PS1 and PS2 are sequenced to move the charge packets into register 70 from under electrode 66, and then serially through register 70 into detection device 73. Also, the SP1-SP2 clock sequence continued to refill register 50.

Figure 4:
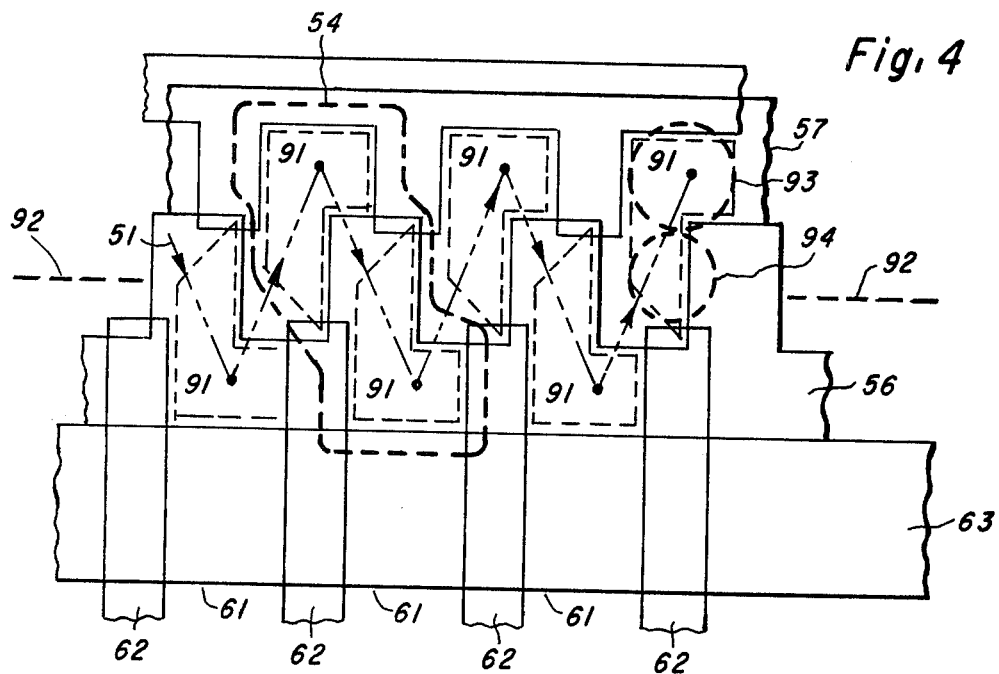
FIG. 4 is a greatly enlarged top view of a portion of the serial-parallel register that is utilized by the SPS memory block of FIG. 2.

Referring now to FIG. 4, a top view, greatly enlarged, of a portion of register 50 and stack 60 is illustrated. This figure illustrates in greater detail the zig-zag shaped charge transfer path 51 which permits memory block 11 to have a reduced size. Charge transfer path 51 is comprised of a plurality of built in charge storage wells 91. The dashed lines of FIG. 4 define the shape of these storage wells. The wells are laterally offset from each other and lie along a common center line 92 within register 50. Two wells are included in each stage 54 — one well lies under the forward portion of electrode 56 and the other well lies under the forward portion of electrode 57.

Each well 91 has body portion 93 and a tail portion 94. The body portion 93 is relatively wide, and holds the majority of the charge in the well. The tail portion 94 is relatively long and narrow and directs charge into the body portion from the adjacent well.

The wells under first phase electrodes 56 are aligned with the column channels 61. The body portion 93 of these wells completely fill the three sided space formed by adjacent column stops and electrode 63. On the other hand, the wells under second phase electrodes 57 are aligned with the column channel stops 62. Room for space between adjacent wells is provided by the zig-zag shaped charge path. By these geometries, the linear dimension 52 of registers 50 and 70, and the width 67 of stack 60 is greatly reduced for any given charge storage capacity.

In addition, the storage charge capacity of the wells are relatively insensitive to misalignment of the well implant masks with respect to the electrode and channel masks. This is because, in the preferred process used to construct the CCD memory, the column channel stops 62 are formed relatively early whereas the charge storage wells 91 are subsequently formed. In a P-type substrate, the column channel stops are comprised of P+ type implants and an overlying layer of thick oxide. This P+ region and thick oxide acts as a built-in mask for the subsequent implanting of the charge storage wells. That is, photo resist is not needed to mask the column channel stops, and thus any charge storage implants completely fill the region between the column stops. This self-alignment process is similar to the process described in a co-pending application having Ser. No. 598,316 now abandoned by A. Tasch filed July 23, 1975 and assigned to Texas Instruments Incorporated.

Figure 5A:
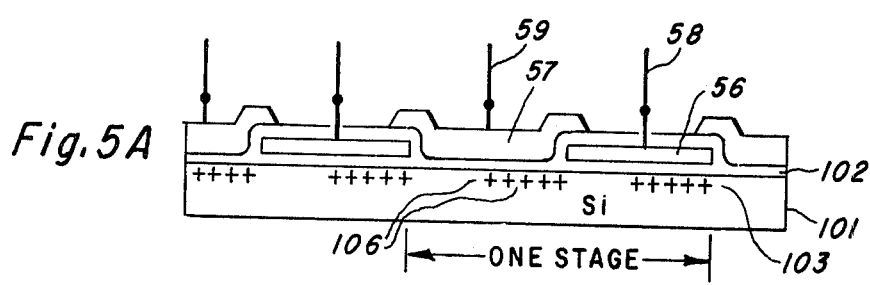
FIG. 5a is a greatly enlarged cross-sectional view of the zig-zag shaped charge transfer path of the serial-parallel register of FIG. 4.

Referring to FIG. 5a, a cross-sectional view taken along the zig-zag charge transfer path 51 of FIG. 4 is illustrated. In one embodiment, charge transfer path 51 is formed on a P-type semiconductor substrate 101, and the charge storage well 91 are formed by N-type implants 103. A thin insulation layer 102 lies on top of substrate 101. First phase electrodes 56 and second phase electrodes 57 alternate on top of the insulating layer along the charge transfer path. Leads 58 and 59 couple respectively to electrodes 56 and 57.

Figure 5B:
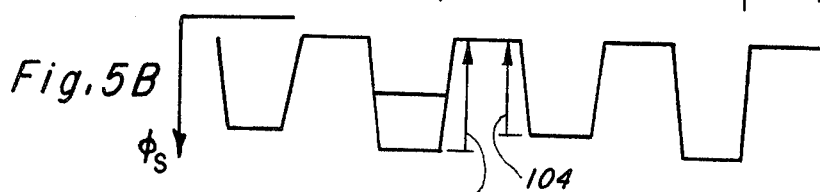
Figure 5C:
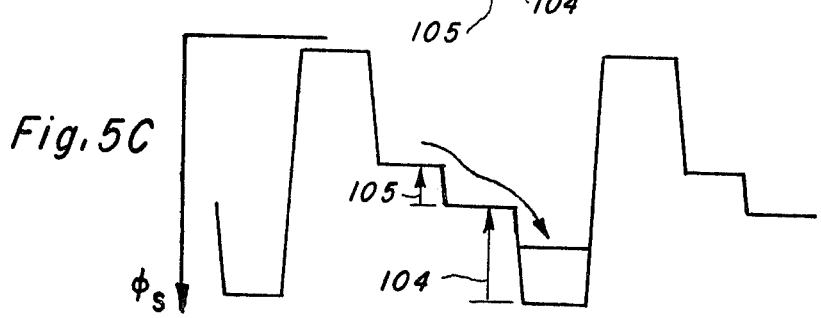

A fixed diffusion voltage 104 is created on surface 104 by the N-type implants 103 lying under electrodes 56 and 57. When the clock signals on leads 58 and 59 are both near ground, charge is trapped on surface 104 in the implant region by the diffusion voltage. But the voltage barrier 105 between adjacent electrodes can be varied by the clocks on leads 58 and 59, and it approximately equals the fixed diffusion voltage minus the difference in the clock voltages. FIG. 5b illustrates how charge is trapped by the diffusion voltage created by implants 103 when the clock on leads 58 and 59 are both near ground; and FIG. 5c illustrates the barrier voltage 105 between two adjacent implants when the clock on lead 59 is raised to a high voltage while the clock on lead 58 remains near ground.

Referring to FIG. 6, a top view, greatly enlarged, of a portion of stack 60 and parallel-serial register 70 is illustrated. Comparing this figure to FIG. 4 shows that parallel-serial register 70 has an architecture similar to serial-parallel register 50.

Each stage 72 of register 70 contains two potential wells 111; and each potential well has a wide body portion 112 and a long narrow tail portion 113. Potential wells 111 are laterally offset from each other, and the tail portions 113 lie along a common center line 79 within register 70. This arrangement of the wells forms zig-zag charge transfer path 71, and reduces the linear dimension of register 70 for a given charge storage capacity and alignment tolerance. The reduced linear dimension of register 70 allows the column channels 61 to have a smaller center-to-center spacing, thus reducing the area occupied by stack 60.

As a second embodiment, a buried channel CCD memory may be constructed. The buried channel embodiment has an architecture which is very similar to the architecture illustrated in FIG. 5a. The only difference is that an implant of opposite polarity to that of substrate 101 is included in surface 106. This implant shifts the maximum potentials which occur from surface 106 into substrate 101, thereby creating a channel for charge which lies slightly beneath surface 101.

Various embodiments of the invention have now been described in detail. However, several other obvious variations of these described embodiments exist. For example, it will be obvious to those skilled in the art, that N-type substrates with P-type implants forming the charge storage wells can also be used to construct the invention. Also, more sophisticated charge storage wells utilizing both N and P implants could be used. In addition, several modifications and variations of clock frequency or waveform may be used to transfer charge through the SPS memory block. Since it is obvious that many changes and modifications can be made in the above details without departing from the nature and spirit of the invention, it is understood that the invention is not to be limited to said details except as set forth in the appended claims.

What is claimed is:

1. A charge coupled device register having a zig-zag shaped charge transfer path comprising:
   (a) a semiconductor substrate having dopant atoms of a first type and a first surface;
   (b) an insulating layer lying on said first surface;
   (c) first and second elongated phase electrodes lying on said insulating layer, each of said phase electrodes having one side that is relatively straight and another side that has spaced apart teeth, said teeth of said first and second electrodes being interleaved with each other;
   (d) a transfer electrode lying on said insulating layer next to said straight side of said first electrode;
   (e) a first channel stop region lying under said straight side of said second electrode and having spaced apart portions extending under said teeth of said first electrode; and
   (f) a plurality of spaced apart channel stop regions respectively extending from under said teeth of said second electrode to under said parallel transfer electrode, said plurality of channel stop regions together with said first channel stop region and said interleaved electrodes forming a zig-zag shaped serial transfer path.

2. A register according to claim 1 and further including input means for injecting charge packets into said substrate near said first surface at one end of said elongated electrodes to form a serial-parallel register with a zig-zag shaped serial transfer path.

3. A register according to claim 1 and further including output means for detecting charge packets in said substrate near said first surface at one end of said elongated electrode, to form a parallel-serial register.

4. A register according to claim 1 wherein said teeth are rectangular shaped.

5. A register according to claim 1 and further including a plurality of spaced apart doped regions comprised of atoms of a second type opposite to said first type, said regions lying in said substrate near said first surface respectively under a portion of each of said teeth.

6. A register according to claim 5 wherein said doped regions have an irregular shape including a relatively narrow portion under said teeth and a relatively wide portion extending from under said teeth to under said straight side of said respective electrodes.

7. A register according to claim 1 wherein each channel stop region of said plurality is relatively narrow, and the spaces between said plurality are relatively wide.

8. A charge coupled device memory comprised of a serial-parallel-serial memory block; said block including an N-stage serial-parallel charge coupled device register, an M-stage charge coupled device stack, and an N-stage parallel-serial charge coupled device register; said stack having N inputs coupled to N parallel outputs of said serial-parallel register, and having N outputs coupled to N parallel inputs of said parallel-serial register thereby forming a serial-parallel-serial charge transfer path; wherein each of said registers have a zig-zag shaped serial charge transfer path to decrease their linear dimension and the width of said stack.

9. A charge coupled device memory according to claim 8 and further including a plurality of said blocks and means for selectively addressing individual blocks of said plurality to read or write the contents thereof as a continuous block of data.

10. A charge coupled device memory according to claim 8 wherein said serial-parallel register and said parallel-serial register are each comprised of:
   (a) a semiconductor substrate having a first surface;
   (b) an insulating layer lying on said first surface;
   (c) first and second elongated phase electrodes lying on said insulating layer, each of said phase electrodes having one side that is relatively straight and another side that has spaced apart teeth, said teeth of said first and second electrode being interleaved with each other;
   (d) a parallel transfer electrode lying on said insulating layer next to said straight side of said first electrode;
   (e) a channel stop region lying under said straight side of said second electrode and having spaced apart portions extending under said teeth of said first electrode; and
   (f) a plurality of spaced apart channel stop regions respectively extending from under said teeth of said second electrode to under said parallel transfer electrode, said plurality of channel stop regions together with said first channel stop region and said interleved electrodes forming a zig-zag shaped serial transfer path.

11. A memory according to claim 10 wherein said teeth are rectangular shaped.

12. A memory according to claim 10 and further including a plurality of spaced apart doped regions comprised of atoms of a second type opposite to said first type, said regions lying in said substrate near said first surface rspectively under a portion of each of said teeth.

13. A memory according to claim 12 wherein said doped regions have an irregular shape including a relatively narrow portion under said teeth and a relatively wide portion extending from under said teeth to under said straight side of said respective electrtodes.

14. A memory according to claim 10 wherein each channel stop region of said plurality is relatively narrow, and the spaces between said plurality are relatively wide.

* * * * *